(12) United States Patent
Roberson

(10) Patent No.: US 9,810,720 B2
(45) Date of Patent: Nov. 7, 2017

(54) SYSTEM AND METHOD FOR MONITORING A POWER LINE WITHOUT CONNECTING TO GROUND

(71) Applicant: Hershel Roberson, Johnson City, TX (US)

(72) Inventor: Hershel Roberson, Johnson City, TX (US)

(73) Assignee: CLEAVELAND/PRICE INC., Trafford, PA (US)

( * ) Notice: Subject to any disclaimer, the term of this patent is extended or adjusted under 35 U.S.C. 154(b) by 10 days.

(21) Appl. No.: 15/156,322

(22) Filed: May 16, 2016

(65) Prior Publication Data

US 2017/0023619 A1  Jan. 26, 2017

Related U.S. Application Data

(60) Provisional application No. 62/162,644, filed on May 15, 2015.

(51) Int. Cl.
*G01R 1/20* (2006.01)
*G01R 15/18* (2006.01)
*G01R 31/40* (2014.01)

(52) U.S. Cl.
CPC .......... *G01R 15/181* (2013.01); *G01R 31/40* (2013.01)

(58) Field of Classification Search
CPC .. G01R 1/203; G01R 15/146; G01R 19/0007; G01R 1/20; G01R 1/22; G01R 1/14; G01R 11/10; G01R 11/21; G01R 23/02; G01R 31/2881; G01R 33/3854; G01R 5/00; G01R 5/14; G01R 9/02; G01R 9/04
See application file for complete search history.

(56) References Cited

U.S. PATENT DOCUMENTS 9,182,429 B2 * 11/2015 Saxby ..................... G01R 21/00
2008/0077336 A1 * 3/2008 Fernandes ............ G01R 15/142
702/57

* cited by examiner

*Primary Examiner* — Tung X Nguyen
(74) *Attorney, Agent, or Firm* — Ronald S Lombard

(57) ABSTRACT

An improved system and method for monitoring power lines without connecting to ground is disclosed herein. An improved sensory assembly can comprise a first end, a second end, a voltage sensor, a current sensor, an analog to digital converter, and a sensory transceiver. The first end can be electrically connectable to a first phase of a power line. The second end can be electrically connectable to a second phase of the power line. The voltage sensor can be capable of measuring a voltage between the first phase and the second phase. The current sensor can be magnetically coupled to the power line. The analog to digital converter can be capable of receiving a first signal from the voltage sensor, and can be capable of receiving a second signal from the current sensor.

18 Claims, 9 Drawing Sheets

SYSTEM AND METHOD FOR MONITORING A POWER LINE WITHOUT CONNECTING TO GROUND

BACKGROUND

This disclosure relates to a system and method for monitoring a power line without connecting to ground.

In earlier times the measurement of low level currents on ground conductors, signal cables, and other physical structures has been used as diagnostic tools for power quality analysis. Ground currents are measured in order to detect an unwanted connection between system conductors or with ground. Ground currents can be evidence of a damaged power system, such as when a tree falls on a power line. Undetected ground faults can cause problems with different production and/or industrial processes. Thus, unnoticed ground faults can damage or even shutdown equipment, affecting productivity. Additionally, ground faults can result in dangerous voltage that poses potential health and safety risks such as fire or electric shock.

Over time, monitoring systems for ground and phase currents have evolved. One system presently known in the art monitors ground and phase currents, and is capable of calculating voltage and phase currents on each individual power lines and at the same time is also capable of doing calculations that look at all the lines together. However, such method requires a ground connection to get accurate calculations.

As such it would be useful to have an improved system and method for monitoring power lines using phase-to-phase monitoring.

SUMMARY

An improved system and method for monitoring power lines without connecting to ground is disclosed herein. An improved sensory assembly can comprise a first end, a second end, a voltage sensor, a current sensor, an analog to digital converter, and a sensory transceiver. The first end can be electrically connectable to a first phase of a power line. The second end can be electrically connectable to a second phase of the power line. The voltage sensor can be capable of measuring a voltage between the first phase and the second phase. The current sensor can be magnetically coupled to the power line. The analog to digital converter that can be capable of receiving a first signal from the voltage sensor, and can be capable of receiving a second signal from the current sensor. The first signal can be proportional to the voltage. The second signal can be proportional to a current on the first phase of the power line. Moreover, the analog to digital converter can sample the first signal to produce a digital voltage signal, and can sample the second signal to produce a digital current signal representing the current on the first phase. The digital voltage signal can be representative of the voltage. The sensory transceiver can be electrically connected to the analog to digital converter that can wirelessly receive timing device, and can wirelessly transmit the digital voltage signal and the digital current signal. The digital voltage signal and the digital current signal can comprise timing data related to the timing information.

DETAILED DESCRIPTION

Described herein is a system and method for monitoring a power line without connecting to ground. The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

Figure 1:
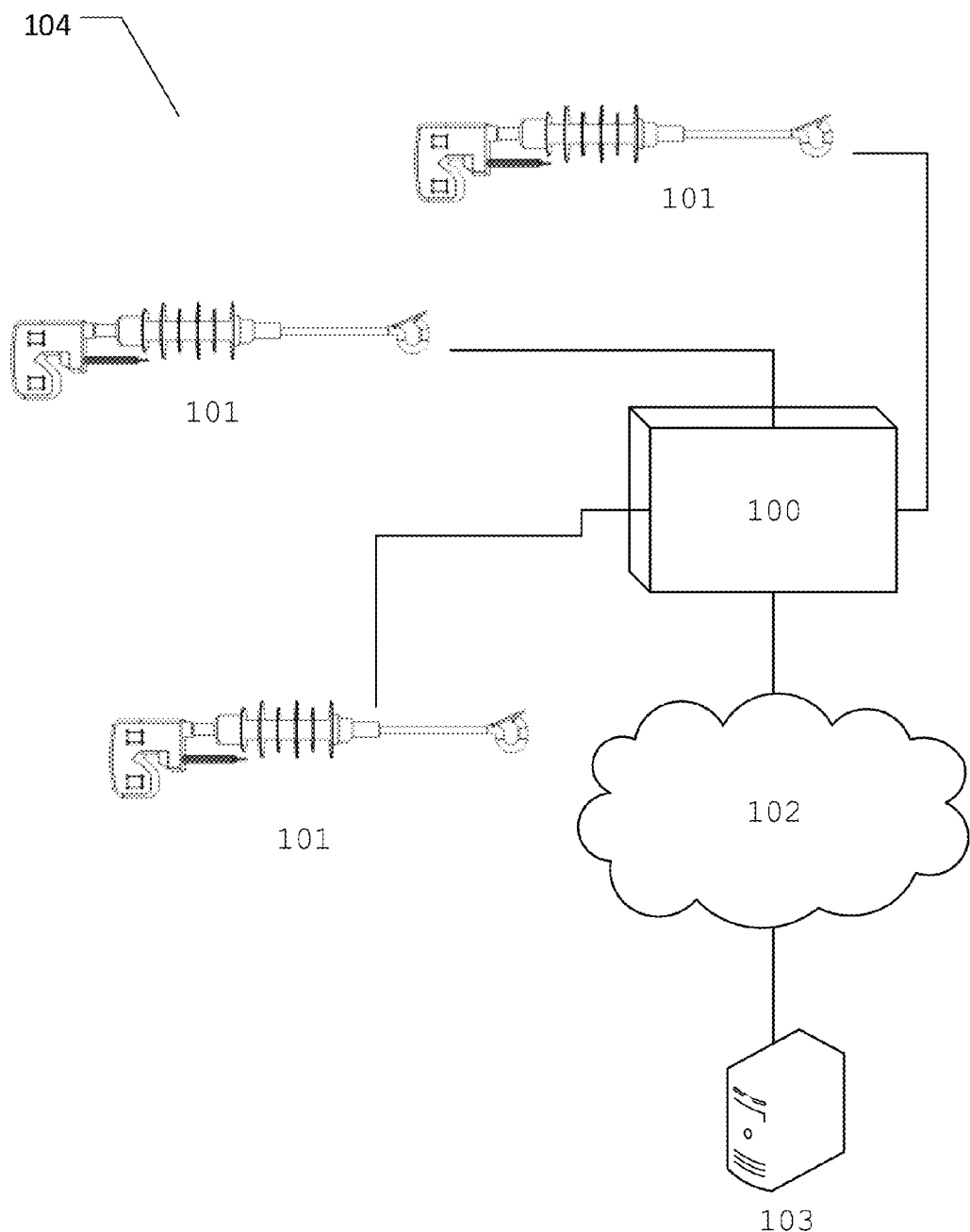
FIG. 1 illustrates a power line monitoring system.

FIG. 1 illustrates a power line monitoring system 104. Power line monitoring system 104 can comprise a common assembly 100, a sensory assembly 101, a network 102, and a monitoring computer 103. Sensory assembly 101 can receive and send data. Data can, in one embodiment, comprise an electrical signal. Once received, sensory assembly 101 can send an electrical signal to common assembly 100. Common assembly 100 can process received data. Once processed, common assembly 100 can, in one embodiment, send data through network 102. Network 102 can be a local area network (LAN), a wide area network (WAN) or a combination of LANs, WANs. One illustrative LAN is a network within a single business. One illustrative WAN is the Internet. For the purposes of this disclosure, network 102 can comprise analog and digital cables.

Data in network 102 can be sent to and/or accessed by monitoring computer 103. Monitoring computer 103 can comprise any equipment capable of carrying out arithmetic and logic operations. Monitoring computer 103 can store and send out data information via network 102. Monitoring computer 103 can include, but is not limited to, a laptop and/or a mobile device. Once received, monitoring computer 103 can perform other operations on the data.

Figure 2:
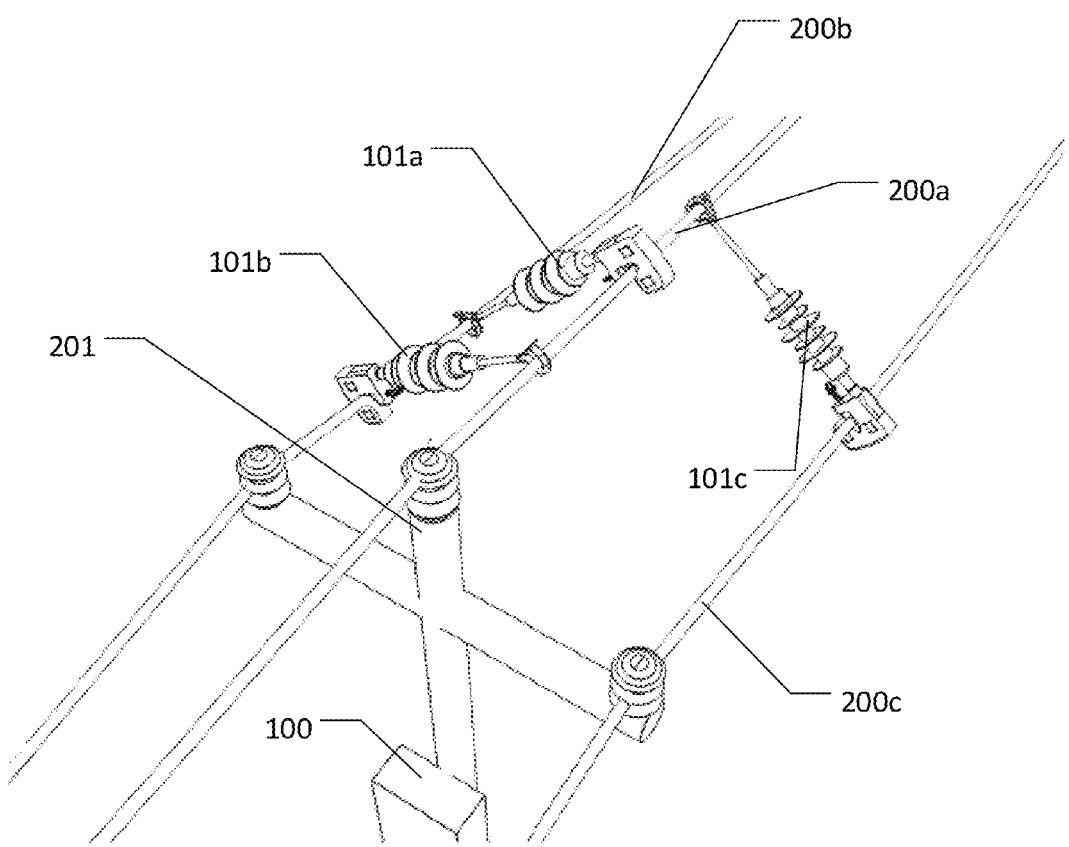
FIG. 2 illustrates a power line monitoring system mounted to a utility pole and power lines.

FIG. 2 illustrates a power line monitoring system 104 mounted to a utility pole 201 and power lines 200. Each sensory assembly 101 can attach directly to each power line 200, in one embodiment, or even the conductor of power lines 200, in another embodiment. Each sensory assembly 101 on each power line 200 can also connect to any other phase of power lines 200 through a high-voltage resistor. After connection to power lines 200, sensory assembly 101 can monitor an electrical signal from power line 200, the electrical signal proportional to the electricity flowing through power line 200. Each sensory assembly 101 can physically connect across two phases. In this embodiment, a first end of sensory assemble 101 can attach to one phase while another end of sensory assemble 101 can attach to another phase. Further in one embodiment, each sensory assembly 101 can be powered by power line 200.

In one embodiment, common assembly 100 can be attached to utility pole 201, in one embodiment. Location of common assembly 100 at utility pole 201 can allow common assembly 100 the proximity to facilitate reception of data from sensory assembly 101. Common assembly 100 can then send data regarding the electrical current, for example, of power lines 200 to network 102. Network 102 can then send and/or make data accessible to monitoring computer 103. In one embodiment, network 102 and monitoring computer 103 can be located separately from on site power line 200 and/or utility pole 201. In one embodiment, communication between sensory assembly 101 and common assembly 100 can be wireless. In one embodiment, network 102, and monitoring computer 103 can be wireless.

Figure 3A:
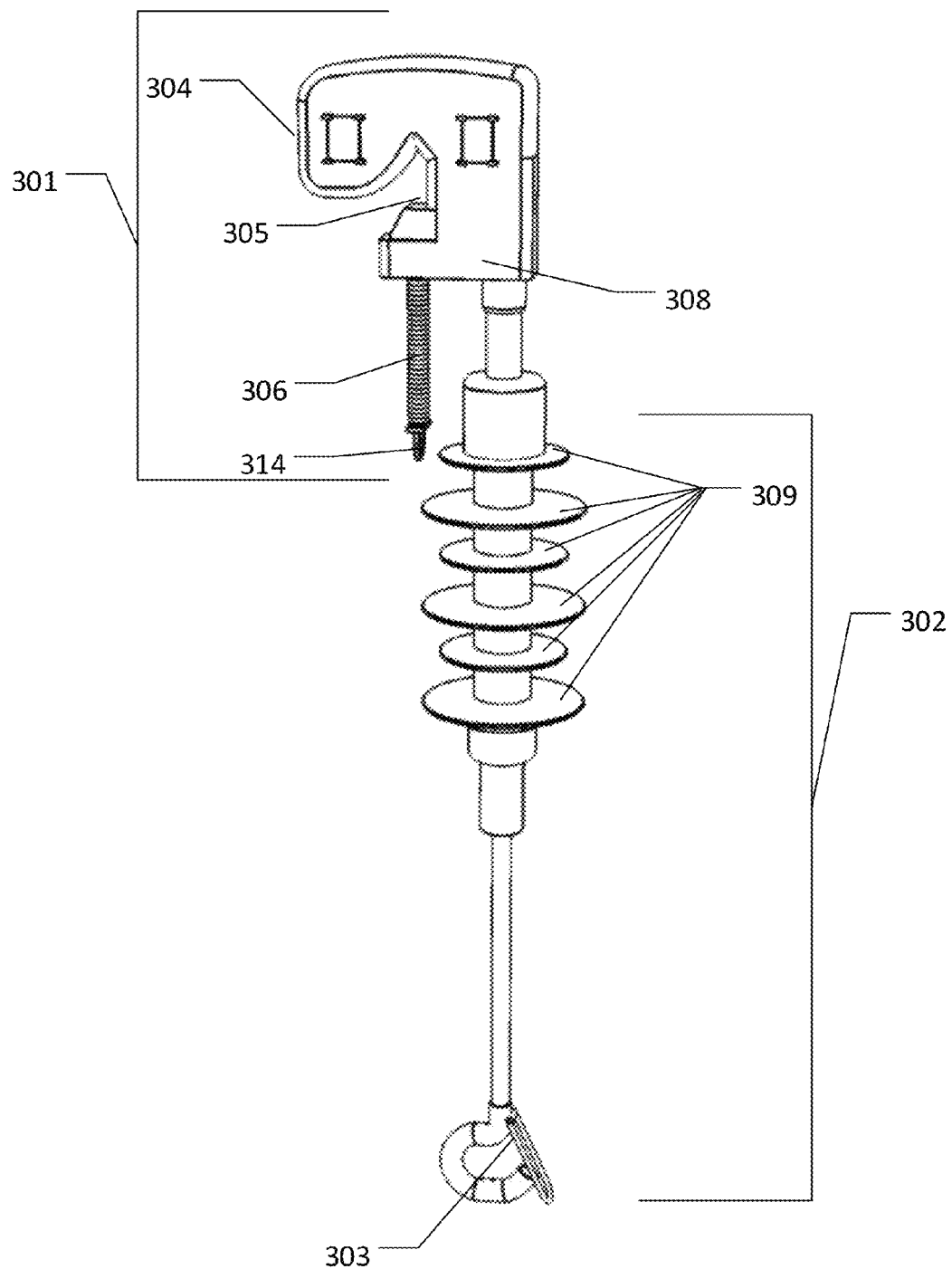
FIG. 3A illustrates a sensory assembly.

FIG. 3A illustrates a sensory assembly 101. In this embodiment, sensory assembly 101 can comprise a first end 301, and a second end 302. In one embodiment, first end 301 can comprise a fastener 300. Fastener 300 can also comprise a bolt 306 and/or a clamp 307. Sensory assembly 101 can also comprise an outer frame 304, which fastener 300 can be attached to. Structure of outer frame 301 can comprise a concave insert 305. Outer frame 304 can comprise a ramp 308 on a side adjacent to concave insert 305. Furthermore, sensory assembly 101 can comprise a plurality of cooling fins 309 along the body or shaft of outer frame 301. Cooling fins 309 can increase the high-voltage creep distance. Second end 302 can comprise a connector 303. Connector 303 can be capable of electrically connecting sensory assembly to a different phase on power line 200, which can include but are not limited to clamp, clips, and/or anchor rod.

First end 301 of sensory assembly 101 can be capable of physical and electrically attaching onto power lines 200 or conductor of power lines 200 by fastener 300. In one embodiment, fastener 300 on first end 301 can comprise a single piece of wire, for example, which can be metallic, in one embodiment. Bolt 306 can pass through outer frame 304 and push clamp 307 onto powerline 200.

In one embodiment, outer frame 304 can comprise a shape accommodating the attachment of sensory assembly 101 onto power line 200. In one embodiment, shape of outer frame 304 can comprise a concave insert 305. Concave insert 305 can be a space or ridge in outer frame 304 shaped to fit around power line 200. Shape of concave insert 305 can allow outer frame 304 to grasp power line 200 and act as a pocket capable of surrounding most of the surface of power line 200.

In one embodiment, fastener 300 can comprise a bent, outward curve shape that can allow fastener 300 to catch power line 200. In one embodiment, first end 301 can attach to one phase of power line 200 while second end 302 can physically and electrically connect to another phase.

Figure 3B:
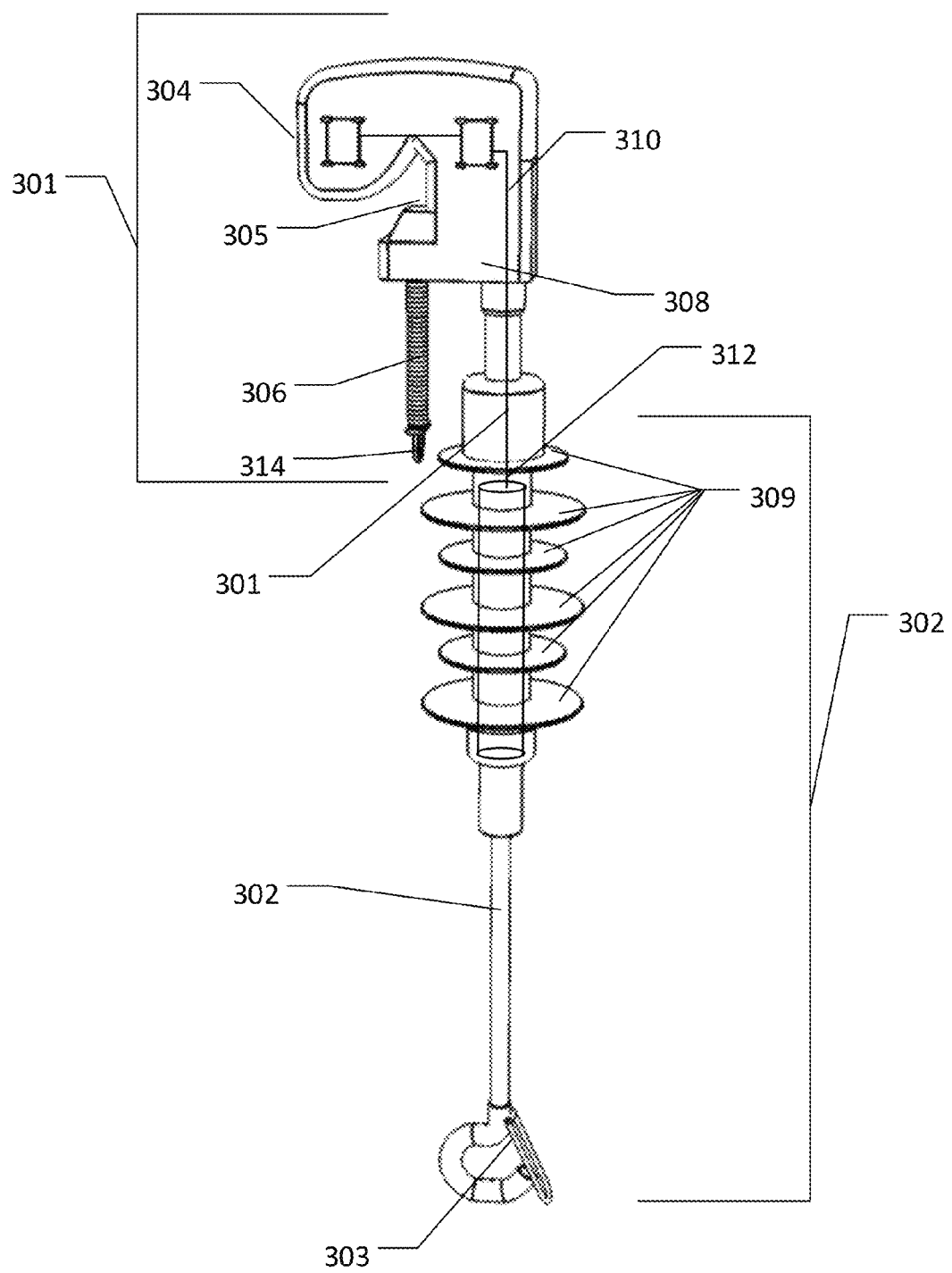
FIG. 3B illustrates an internal mechanical view of a sensory assembly.

FIG. 3B illustrates an internal mechanical view of sensory assembly 101. Sensory assembly can comprise a printed circuit board 310. Printed circuit boards 310 can comprise a plurality of air core pickup coils 311. Air core pickup coils 311 can be attached to a high voltage resistor 312. Once attached, sensory assembly 101 can be capable of receiving current from power line 200.

Air core pickup coils 311 can be used to pick up current from power line 200. In one embodiment, air core pickup coils 311 can be Rogowski coils. In one embodiment, concave insert 305 can be an aluminum part. As power line 200 is captured by concave insert 305 it is held in the center of air core pickup coils 311, by fastener 300. Air core pickup coils 311 can be in phase with respect to a magnetic field centered between them. Air core pickup coils 311 can be out of phase to a field from a distance, specifically in relation to other power lines 200, which they are not touching. Air core pickup coils 311 can complete current by way of printed circuit board 310.

High voltage resistor 312 can cause a small current, typically in the milliamp range, to flow through circuitry on printed circuit board 310, to concave insert 305 in contact with power line 200. Voltage resistor 312 can connect between first end 301 and second end 302. Ends 301 and 302 can comprise wiring capable of inducing current. Voltage resistor 312 can be highly resistive and capable of standing off the maximum expected surge voltage between phases of power lines 200. In one embodiment, voltage resistor 312 can be a variety of inches in length and made to be made longer for higher voltage power lines 200, as an increasing in length of voltage resistor 312 can result in a higher ohm voltage resistor 312. In one embodiment, voltage resistor 312 can be 10 inches long and ½ inch diameter for an embodiment where power line 200 is 15 kilovolts (kV). In another embodiment, voltage resistor 312 can be longer for higher voltage embodiments of power line 200.

Voltage resistor 312 can be connected to printed circuit board 310 at first end 301 and further connected to connector 303 at an opposing second end 302. As a result, voltage can be measured from the junction point of voltage resistor 312 and phases of power line 200. Fins 309 can increase the electrical creep distance from power line 200 to voltage resistor 312 and ultimately to connector 303. As a result, the surface distance along the current's path can be increased, protecting insulation of sensory assembly 101.

A hot stick ring 314 can be attached on a side opposite of fastener 300 and/or concave insert 305. Hot stick ring 314 can allow sensory assembly 101 to be attached to a hot stick, which is commonly used for installation by people having ordinary skill in the art. By way of hot stick ring 314, an installer can elevate sensory assembly 101 so that power line 200 is between a ramp 308 and outer frame 304. Ramp 308 can be an angled slope shaped along outer frame 304. In one embodiment, as sensory assembly 101 can be pulled down, a spring-loaded fastener 300 can extend until power line 200 gets to ramp 308 that leads into concave insert 305. The downward force on sensory assembly 101 can cause power line 200 to travel along angle of ramp 308 and seat in concave insert 305.

Figure 3C:
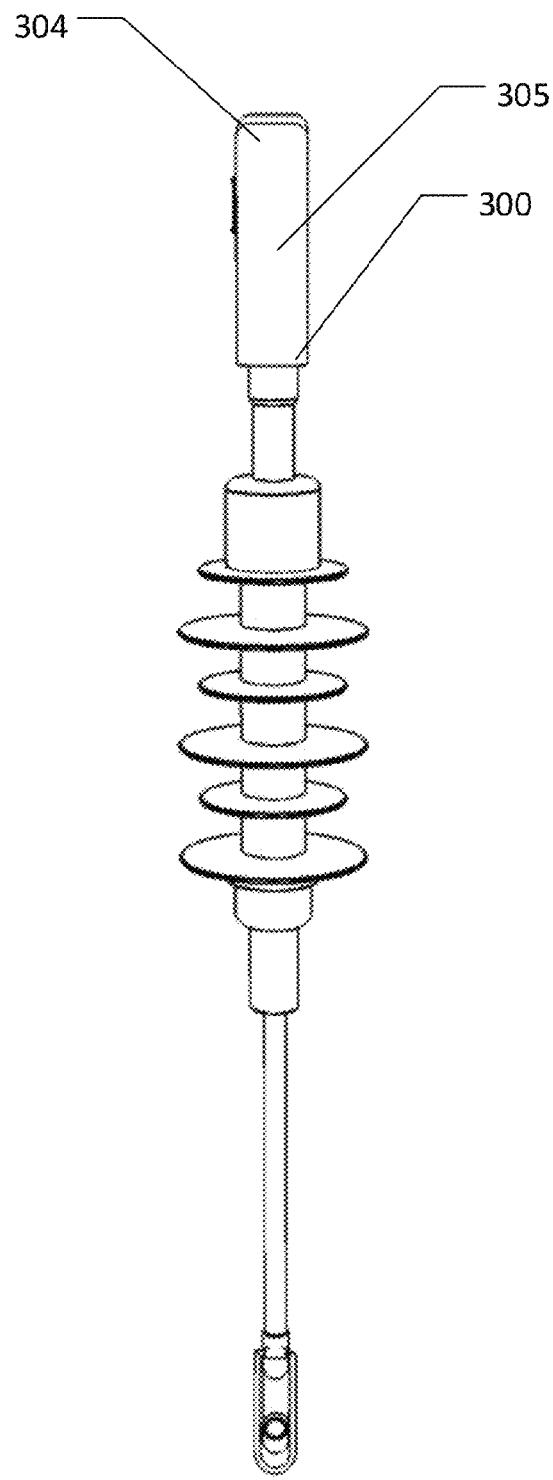
FIG. 3C illustrates a front view of a sensory assembly

FIG. 3C illustrates a front view of sensory assembly 101. In one embodiment, fastener 300 can be attached as a loop at two sides of sensory assembly 101. Fastener 300 can be a length that extends over and/or beyond concave insert 305. As a result, the frame of fastener 300 can be parallel to the edges of concave insert 305. In conjunction with fastener 300, in one embodiment, concave insert 305 can be positioned directly behind or beneath fastener 300. In one embodiment, fastener 300 can be pulled away from outer frame 304 in an open position and then clasped shut over power line 200 at concave insert 305 in a closed position. As a result of tension, fastener 300 can be capable of grasping power line 200 and housing it within concave insert 305.

Figure 3D:
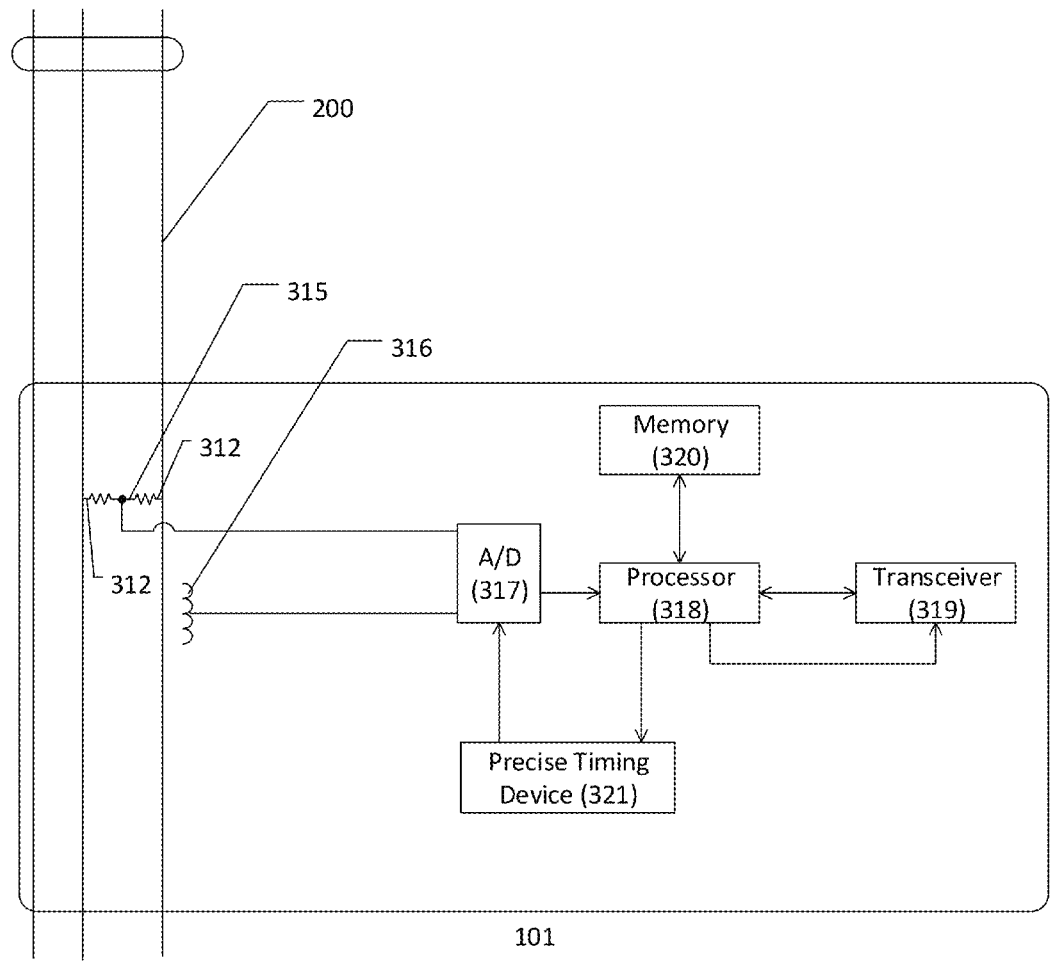
FIG. 3D illustrates an internal view of sensory assembly.

FIG. 3D illustrates an internal view of sensory assembly 101. Sensory assembly 101 can comprise a voltage meter 315, current meter 316, an analog to digital converter (A/D converter) 317, a sensory microprocessor 318, a sensory transceiver 319, a sensory memory 320 and a precise timing device 321. In one embodiment, voltage meter 315 can be a voltage divider circuit. Such voltage divider circuit can comprise small resistor on printed circuit board 310 and high voltage resistor 312, in one embodiment. In one embodiment, current meter 316 can be one or more coils upon which power line 200 current can induce a coil current. Analog to digital converter 317 can convert data from an analog format to a digital format. Sensory microprocessor 318 can make logical calculations, process and transmit digital data, send electrical signals to other parts of sensory assembly 101, and/or perform a variety of other computational functions. Sensory transceiver 319 can wirelessly transmit and receive electronic data. Sensory memory 320 can store data and/or electronic signals away to be used or transmitted later at a specified time. Precise timing device 321 can be used as the mechanism to time the sending of a signal, such as for the synchronization of sensory assembly 101, which will be discussed more thoroughly below.

Once voltage meter 315 and current meter 316 read line voltage and line current power line 200, and transmit voltage reading and current reading to A/D converter 317. In one embodiment, voltage meter 315 can be a voltage divider circuit. In one embodiment, current meter 316 can be a Hall Effect Sensor or a coil. A/D converter 317 can translate raw, analog data sampled into digital voltage data and/or digital current data. A/D convertor 317, in one embodiment, can sample voltage reading and current reading at least 16 samples per power line cycle. In another embodiment, analog to digital converter 317 can be capable of sampling voltage and current at a greater rate. Using timing information from precise timing device 321, A/D converter 317 can include timing data within or along with digital voltage and/or digital current data to microprocessor, hereinafter referred to "digital data."

Sensory microprocessor 318 can receive digital data. In one embodiment, sensory microprocessor 318 can filter the digital data received from A/D converter 317 using digital signal processing algorithms. Once filtered, raw data samples can be scaled to fit a digital format compatible with sensory transceiver 319. As necessary, sensory microprocessor 318 can store digital data and computations in memory 320.

Sensory microprocessor 314 can send digital data to transceiver 319. Transceiver 319 can then send digital data to common assembly 100. Transceiver 319 can further receive precision timing data from common assembly 100. Transceiver 319 can transmit the precision timing data to sensory microprocessor 314, which can then send precision timing data to precision timing device 321. In one embodiment, precise timing device 321 can be a separate device that receives a timing signal from sensory microprocessor 318 and sends a timing signal to A/D convertor 317. In one embodiment, precise timing device 321 can be built into sensory microprocessor 318. Precise timing device 321 can provide timing information to analog to digital converter 317. Precise timing information is necessary to do calculations using digital data from multiple sensory assemblies 101, as will be discussed further below. Sensory microprocessor 318 can set sensory transceiver 319 to transmit or receive mode, as it can act as a control line for sensory transceiver 319.

Further as an example shown in FIG. 2, each sensory assembly 101 can connect across two phases. A first sensory assembly 101a can sample current on a power line phase A 200a, and the voltage across phase A 200a and phase B 200b. A second assembly 101b can sample current on power line phase B 200b, and the voltage across phase B 200b and phase A 200a. Lastly, a third assembly can sample current on power line phase C 200a, and the across phase C and phase B 200b. Sensory assemblies 101 can send current samples to common assembly 100 for all three currents, and phase-to-phase voltage samples for power line phase A 200a to power line phase B 200b, and power line phase B 200b to power line phase C 200c.

Figure 4:
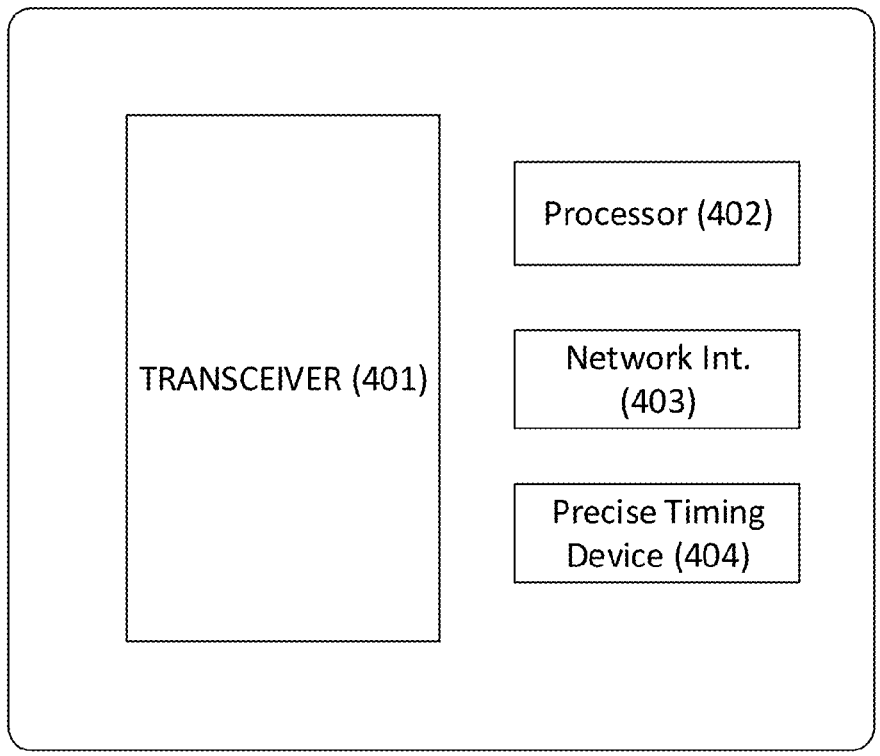
FIG. 4 illustrates an internal view of a common assembly.

FIG. 4 illustrates an internal view of common assembly 100. Common assembly 100 can comprise a common transceiver 401, a common processor 402, a networking interface 403, and a second precision timing device 404. Common transceiver 401 can wirelessly transmit and can receive electronic data between common assembly 100 and each sensory assembly 101. Furthermore, in one embodiment, common transceiver 401 can interface common assembly 100 with network 102, to communicate with monitoring computer 103. Common assembly 100 can receive digital data and can perform logical calculations on digital data from each sensory assembly. Specifically, common transceiver 401 can send digital data it receives from sensory transceiver 319, to common processor 402, in a format that common processor can understand. Common processor 402 can receive data from common transceiver 401. Common processor can then make logical calculations, can process and can transmit digital data, can send electrical signals to other parts of common assembly 100, and can perform a variety of other computational functions. As an example discussed in FIG. 3D, since samples taken from power lines 200 are synchronized, common transceiver 319 can calculate the voltage from power line phase A 200a to power line phase C 200c, then calculate the voltage vectors for each of the three phases to ground, which enables it to do any calculation it could do if the sensory assembly were connected through high voltage resistor 312 to ground. Any combination of phase-to-phase connections can be accommodated, with each sensory assembly 101 on each power line 200, connected via high voltage resistor 312 to any other phase.

A second precise timing device 404 can receive signals from microprocessor 402. Second precise timing device 404 can create a signal to send through common transceiver 401 to each sensory assembly 101 to synchronize each sensory assembly 101. Furthermore, network interface 403 can adapt common assembly 100 to another network 102 and/or monitoring computer 103.

Second timing device 404 can send data, which can causes sensory assembly 101 to coordinate timing of when voltage data and current data is measured from power line 200. Precise timing device 404 can receive data from processor 402 and resend signals through transceiver 401 to sensory assembly 101, in one embodiment. In another embodiment, precise timing device 404 can resend signals back through processor 402, which can then send data through common transceiver 401 and, ultimately back to sensory transceiver 319. With timing data from common precise timing device 404, each sensory assembly 101 can be synchronized to each other to sample digital data simultaneously, for example. This synchronization can facilitate the comparison and analysis of wave forms for the voltage and current on each power line, by common assembly 100. As a result, synchronization can allow for both current and voltage waves to be monitored precisely by common assembly 100. As discussed further below, synchronization can alert power line monitoring system 104 to any misalignments shown in the wave data information received.

Aside from data transfer, common microprocessor 402 can calculate digital information after receiving synchronized signals back from sensory assembly 101. Specifically, microprocessor 402 can calculate the root-means-square value (RMS) of the voltage and current, as well as ground current, in one embodiment. In one embodiment, common processor 402 can communicate calculations and waveform data received and processed to monitoring computer 103. Calculations can include, but are not limited to Fourier analysis, voltage and current total harmonic distortion (THD), phase angle between the current and voltage, power factor, wattage and VARS.

Furthermore, network interface 403 can allow common assembly 100 to transfer data and calculations from microprocessor 402 to network 102 and/or monitoring computer 103 associated with monitoring power lines 200. In one embodiment, the wave forms for the voltage and current of each phase and ground can be reconstructed at the common assembly 100. Furthermore, common assembly 100 and/or network 102 can transfer waveform data to monitoring computer 103 using a transient data exchange format, as described in IEEE Std. C37.111. The Institute for Electrical and Electronics Engineers, Inc. describes a standard data exchange format used for power systems and specifically defines an interchange of various types of fault, test, or simulation data for electrical power systems. Furthermore, the Institute describes sampling rates, filters, as well as sample rate conversions for data transfer.

In other embodiments, common assembly 100 may have other functions, such as repairing problems in power line 200. In one embodiment, common assembly 100 can operate a motor operated switch to shift power through the conductors of power lines 200 or switch power to a capacitor bank for power factor control of the power lines 200. In one embodiment, common assembly 100 can comprise a remote terminal unit.

In one embodiment, sensory transceiver 319 and/or common transceiver 401 can comprise a frequency hopping spread spectrum (FHSS) radio can be used for communications between sensory assembly 101 and common assembly 100. Since the FHSS radios of each sensory assembly 101 can be synchronized as well as analog to digital converters 317 of each sensory assembly 101, the frequency hopping interval of 60 Hz can be used to synchronize analog to digital converters 317 to an exact multiple of the hopping frequency, in one embodiment. In one embodiment, the following rates can be appropriate for this scheme: frequency hopping rate of 60 Hz; raw analog to digital sampling rate of 64 samples/cycle or 3,840 samples/second; filtered sample rate of 16 samples/cycle or 960 samples/second; rate data is sent from each sensory assembly of 60 Hz; number of cycles of date sent each cycle of 1; size of each filtered sample of 16 bits. In one embodiment, the minimum data from each sensory assembly 101 in each cycle can include 512 bits (16 bits times 16 samples times 2 channels).

The voltage and current data sampled by sensory assembly 101 can be processed by common assembly 100 on a sinusoidal wave in phases, which can represent the cycle of the current and voltage movement along power line 200 over time, as discussed further below.

Figure 5:
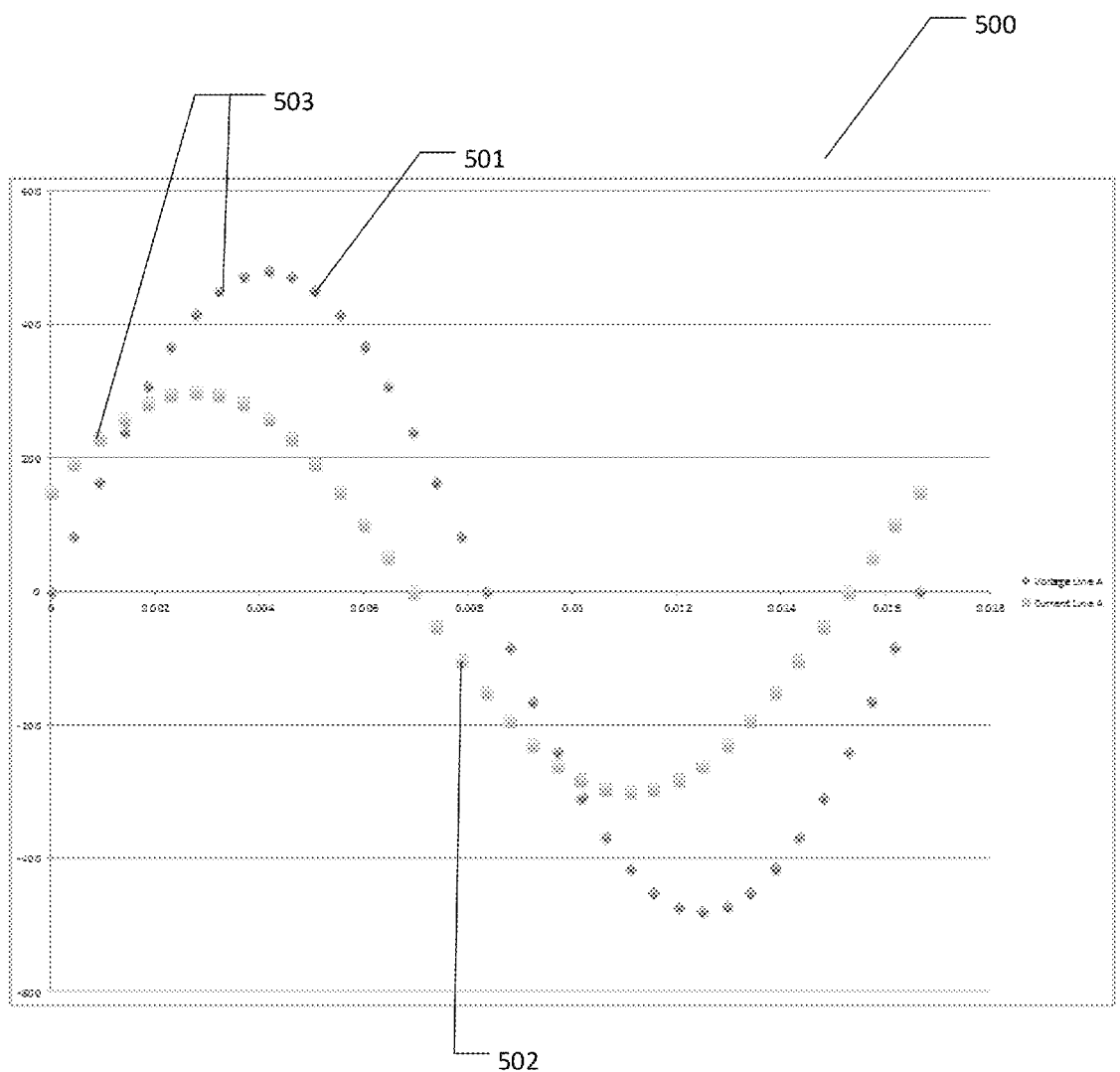
FIG. 5 illustrates a voltage and current sample for a single phase.

FIG. 5 illustrates a voltage and current sample for a single phase on power line 200. Graph 500 is an exemplary, not limiting, representation of wave form data of voltage and current for a single phase of power line 200. In one embodiment, common assembly 100 can send data to produce graph 500 of the electrical activity of power lines 200. Graph 500 illustrates the voltage samples 503, and the current samples 501 of a single phase of a power line 200. RMS values of the voltage and current can be calculated, as well as the relative phase angle between voltage and current on the power line 200, and the power factor for that phase. Furthermore, data can be represented as vectors, instead of points on a graph relating to time. Either manifestation of data can be used in facilitating calculations at any point in the signal chain. Specifically, graph 500 can illustrate a representation of how sensory assembly 101 measures the phase currents at 16 bits times 16 samples in one embodiment. From one single conductor, first wave 501 represents voltage over time, while second wave 502 shows the levels of current over time. Points 503 on first wave 501 and second wave 502 can represent the precise moments sensory assembly 101 took a reading to then yield the wave patterns. As a result, voltage can be compared with current. After analyzing both, adjustments to power lines 200 can be made as needed.

Once data samples are processed and transmitted, the actual waveforms of the currents and voltages can be recreated on power line 200. This data may be used by algorithms in common assembly 100 to calculate voltage and current root-mean-square (RMS), voltage and current total harmonic distortion (THD), phase angle between the current and voltage, power factor, watts and VARS. The sample data from each of the three phase currents can be summed, yielding calculated samples of the neutral or ground current. The resulting data can be sent to monitoring computer 103.

Measurements from sensory assembly 101, microprocessor 402 can calculate, for example, phase differences between lines, and also phase shifts between voltage and current. These calculations can aid in the detection of power inefficiencies. Not only can power line monitoring system 104 calculate values on each individual power line 200, but power line monitoring system 104 can take calculations of the values of all power lines 200 averaged together.

In one embodiment, one calculation on data samples can include Fourier analysis. Specifically, the Fourier analysis can represent any waveform by a set of sine waves. Any pure sine wave can be described by its magnitude and phase, including its size and how it relates to time. Waveform can be represented in two different ways. One way can include showing a collection of points on a graph relating to time, while another way can include showing a collection of vectors. In one embodiment, samples can be used to calculate magnitudes and vectors to facilitate calculations at any point in power line monitoring system 104. While Fourier analysis, in one embodiment, can take place in sensory assembly 101, in another embodiment, Fourier analysis can similarly take place in common assembly 100. In yet another embodiment, Fourier analysis can take place in both common assembly 100 and sensory assembly 101.

Graph 500 is an exemplary, not limiting, representation of voltage data and current data from the same phase of power line 200. On graph 500, the values on the x-axis represent the phase, while the values on the y-axis represent volts for the voltage wave and amps for the current wave. As graph 500 in indicates, two different waves 501 and second wave 502 go through the horizontal axis at different times, signaling a phase shift between voltage and current. From analyzing the data of power line 200, power line monitoring system 104 can calculate power factor to determine whether the power line 200 is leading or lagging. Since both sensory assembly 101 for voltage and current can be synchronized, first wave 501 and second wave 502 on graph 500 can indicate to an operator that a potential phase shift is occurring on power line 200 and producing imaginary power. As a result, an operator, common assembly, or power line monitoring system 104 can apply necessary remedies to power distribution, such as adding or removing a capacitor bank in one embodiment.

Figure 6:
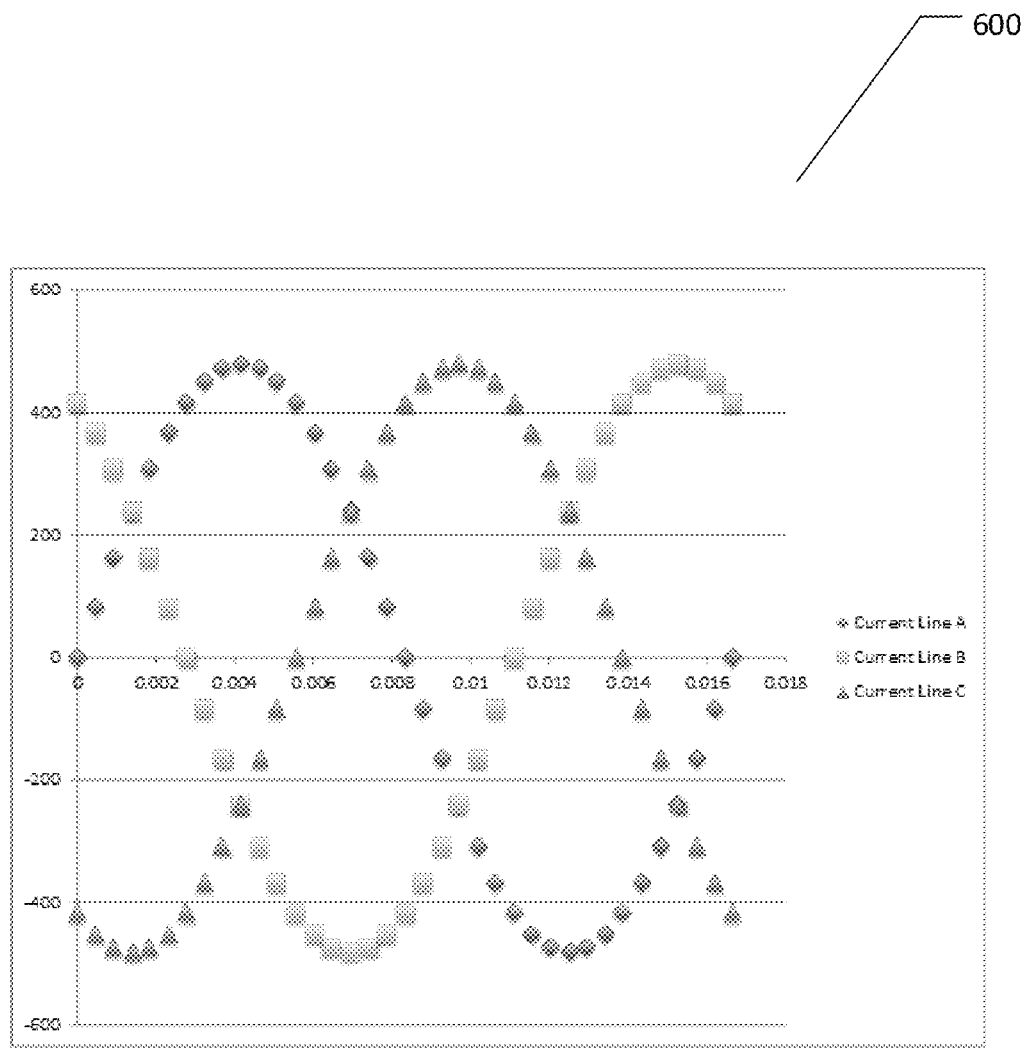
FIG. 6 illustrates voltage samples for three phases.

FIG. 6 illustrates current samples for three phases. Specifically, graph 600 shows three sine waves representing the comparison of current samples of the three phases of power line 200. Graph 600 is an exemplary, not limiting, representation of how current values can be compared over time between different phases of power line 200. Sensory assembly 101 can measure each phase of power line 200. In one embodiment where power line 200 is a 60 Hz system, sensory assembly 101 can sample each line 64 times per cycle, for example. Sensory assembly 101 can then send the values of these points further down power line monitoring system 104 to produce graph 600. Graph 600 can show 36 samples per cycle, in one embodiment. Since current lines B and C have equal amplitude with 120 degrees separation, loads of power line 200 are balanced, and there is no ground current.

Synchronization of sampling at power line 200 can allow the comparison of waveforms for the voltage and current on each of power line 200 conductors to be compared. As a result, common assembly 100 can achieve calculations crucial to monitoring power lines 200. For example, in one embodiment, synchronized data of three conductors of a three phase power lines 200 can help determine ground or neutral current that can be computed as the net real time sum of the three phases of current. In the value of ground current, the sum of the three power line currents is equal and opposite. As a result of aligning the timing of three signals on power line 200, ground current can be calculated and the parameters for a balanced load among the voltage and current can be gauged.

Synchronization of measurements at sensory assembly 101 can allow monitoring system 104 to measure current and voltage levels in the same time frame. As multiple measurements taken by sensory assembly 101 can be synchronized, the sampling times of each analog to digital conversions can occur simultaneously. Without synchronized data, microprocessor 402 of common assembly 100 would be unable to calculate one current's phase relative to either another current or voltage. Specifically in an embodiment comprising a three-phase power line, if three signals are not aligned appropriately in time, then common assembly 100 cannot accurately calculate ground current.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. An improved sensory assembly comprising
a first end electrically connectable to a first phase of a power line;
a second end electrically connectable to a second phase of said power line;
a voltage sensor capable of measuring a voltage between said first phase and said second phase;
a current sensor magnetically coupled to said power line;
an analog to digital converter that
receives a first signal from said voltage sensor, said first signal proportional to said voltage;
receives a second signal from said current sensor, said second signal proportional to a current on said first phase of said power line;
samples said first signal to produce a digital voltage signal, said digital voltage signal representative of said voltage; and
samples said second signal to produce a digital current signal representing said current on said first phase; and
a sensory transceiver electrically connected to said analog to digital converter that wirelessly receives timing device, and transmits wirelessly said digital voltage signal and said digital current signal, said digital voltage signal and said digital current signal comprising timing data related to said timing information.

2. The system of claim 1 wherein each of said sensory assemblies samples said current on said first phase and samples said voltage from said first phase to said second phase of said power line as a response to a transceiver signal from said sensory transceiver.

3. The system of claim 1 wherein said sensory assemblies samples said voltage and said current at a rate of at least 16 samples per power line cycle.

4. The system of claim 1 wherein said voltage sensor can be a voltage divider circuit.

5. The system of claim 1 wherein said sensory assembly comprises a frequency hopping spread spectrum radio, said frequency hopping spread spectrum radio can be used for communication between said sensory transceiver and a common transceiver.

6. The system of claim 1 further comprising a high voltage resistor, said high voltage resistor connects said first end and said second end such that current from said first phase can flow through said second phase of said power line.

7. The system of claim 6 wherein said first end comprises a fastener, said fastener comprises a concave portion shaped to fit around said power line.

8. The system of claim 7 wherein said first end comprise a printed circuit board, said printed circuit board can comprise one or more air core pickup coils, further wherein when said power line is captured within said concave portion said air core pickup coils completes current by way of said printed circuit of said sensory assembly.

9. The system of claim 8 wherein said air core pickup coils can comprise Rogowski coils.

10. The system of claim 6 wherein said second end comprises a connector, said connector capable of electrically connecting said second end of said sensory assembly on said second phase.

11. A method for monitoring a power line without connecting to ground comprising
attaching each of one or more sensory assemblies to a power line, each of said sensory assembly comprising
a first end electrically connectable to a first phase of a power line;

a second end electrically connectable to a second phase of said power line;

a voltage sensor capable of measuring a voltage between said first phase and said second phase;

a current sensor magnetically coupled to said power line;

an analog to digital converter that
  receives a first signal from said voltage sensor, said first signal proportional to said voltage;
  receives a second signal from said current sensor, said second signal proportional to a current on said first phase of said power line;
  samples said first signal to produce a digital voltage signal, said digital voltage signal representative of said voltage; and
  samples said second signal to produce a digital current signal representing said current on said first phase; and a sensory transceiver electrically connected to said analog to digital converter that wirelessly receives timing device, and transmits wirelessly said digital voltage signal and said digital current signal, said digital voltage signal and said digital current signal comprising timing data related to said timing information;

broadcasting said first signal and said second signal from each of said sensory assembly;

receiving said first signal and said second signal by a common transceiver;

transferring said first signal and said second signal to each of said sensory assembly such that said first signal and said second synchronizes sensory assembly readings on a plurality of phases through a precision timing device.

12. The method of claim 11 further comprising the step of sampling said voltage and said current by said sensory assembly at a rate of at least 16 samples per power line cycle.

13. The method of claim 12 further comprising a high voltage resistor, said high voltage resistor connects said first end and said second end such that current from said first phase can flow through said second phase of said power line.

14. The method of claim 13 wherein said first end comprises a fastener, said fastener comprises a concave portion shaped to fit around said power line.

15. The method of claim 14 wherein said first end comprise a printed circuit board, said printed circuit board can comprise one or more air core pickup coils, further wherein when said power line is captured within said concave portion said air core pickup coils completes current by way of said printed circuit of said sensory assembly.

16. The method of claim 15 wherein said air core pickup coils can comprise Rogowski coils.

17. The method of claim 11 wherein said second end comprises a connector, said connector capable of electrically connecting said second end of said sensory assembly on said second phase.

18. The method of claim 17 wherein said connector can comprise a clamp.

* * * * *